(12) United States Patent
Fürsich

(10) Patent No.: US 6,979,773 B2
(45) Date of Patent: Dec. 27, 2005

(54) SCREENING DEVICE FOR ELECTRONIC SUBASSEMBLIES ON A PRINTED CIRCUIT BOARD

(75) Inventor: Walter Fürsich, Dortmund (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/520,714

(22) PCT Filed: May 16, 2003

(86) PCT No.: PCT/EP03/05182

§ 371 (c)(1),
(2), (4) Date: Jun. 6, 2005

(87) PCT Pub. No.: WO2004/008823

PCT Pub. Date: Jan. 22, 2004

(65) Prior Publication Data

US 2005/0205280 A1    Sep. 22, 2005

(51) Int. Cl.[7] .............................................. H05K 9/00
(52) U.S. Cl. .............................. 174/35 GC; 174/35 R; 361/816
(58) Field of Search ........................ 174/35 R, 35 GC; 361/816, 818, 800

(56) References Cited

U.S. PATENT DOCUMENTS

| 5,717,577 | A | 2/1998 | Mendolia et al. |
| 5,847,938 | A * | 12/1998 | Gammon .................... 361/816 |
| 6,239,359 | B1 * | 5/2001 | Lilienthal et al. ...... 174/35 GC |
| 6,781,851 | B2 * | 8/2004 | Daoud et al. ................ 361/818 |

FOREIGN PATENT DOCUMENTS

| EP | 1 061 789 A2 | 12/2000 |
| WO | WO 01/10182 A2 | 2/2001 |

* cited by examiner

Primary Examiner—Hung V. Ngo

(57) ABSTRACT

The invention relates to a screening device comprising: a screening cover, which covers an electronic circuit located on a printed circuit board and comprises an edge that is separated from the component side of the printed circuit board by a gap and a contact device, which is located in the gap and produces an electric connection between the screening cover and a conductive contour element on the printed circuit board. According to the invention, lugs are formed on the edge of the screening cover, said lugs fixing the screening cover on the printed circuit board and maintaining an elastic pretension on the contact device. The contact device is configured as an elastic sealing body that extends continuously through the gap and absorbs electromagnetic waves.

20 Claims, 2 Drawing Sheets

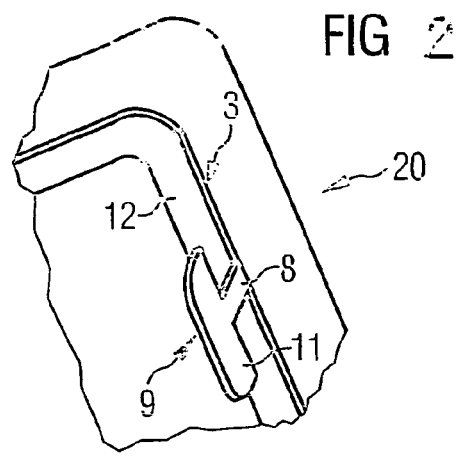
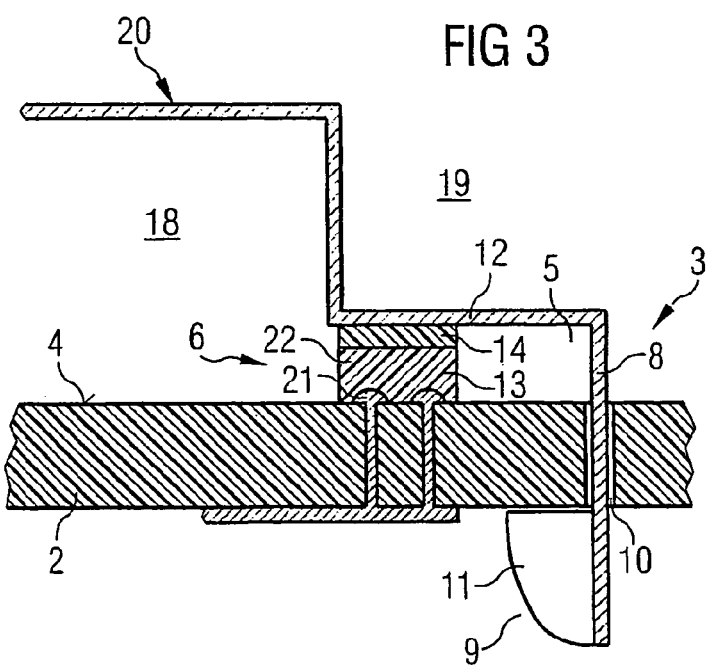
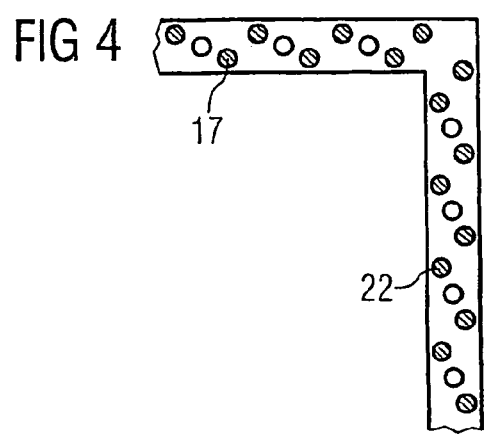

SCREENING DEVICE FOR ELECTRONIC SUBASSEMBLIES ON A PRINTED CIRCUIT BOARD

CROSS REFERENCE TO RELATED APPLICATIONS

This application is the US National Stage of International Application No. PCT/EP2003/005182, filed May 16, 2003 and claims the benefit thereof. The International Application claims the benefits of German application No. 10231145.5 filed Jul. 10, 2002, both applications are incorporated by reference herein in their entirety.

FIELD OF THE INVENTION

The invention relates to a screening or shielding device with a screening cover which covers an electronic circuit located on a printed circuit board, with an edge that is separated from the component side of the printed circuit board by a gap and a contact device which is located in the gap and produces an electrical connection between the screening cover and a conducting contour element on the printed circuit board, with lugs being formed on the edge of the screening cover by which the screening cover is fixed to the printed circuit board and maintaining an elastic pretension on the screening device.

BACKGROUND OF THE INVENTION

In electronics there is frequently a requirement for diminishing electrical or magnetic fields within or outside a specific area. Screening housings which attenuate the emission or entry of electromagnetic interference. On printed circuit boards the interference radiation can also be caused by subassemblies located on the same printed circuit board. With miniaturized subassembles, for example those using SMD technology, interference sinks and interference sources are often immediately adjacent to one another. For screening field values which change over time small designs of multipart screening devices are employed.

They mostly consist of a screening frame subdivided into individual chambers by partition walls and soldered to the printed circuit board. To keep the subassembles covered by the screening accessible for test purposes the screening frame is closed off by a removable cover. Since the frame part only becomes mechanically stable once it is soldered to the printed circuit board it is necessary, when fitting these miniaturized screening devices, to handle the frame part and the cover part together. Putting the cover on and taking it off is a cumbersome process and assembly is time-consuming.

A single-part metallic screening device which can be fitted onto a printed circuit board is known from DE 29 808 620 U1. It is attached by locking lugs which grip the back of the printed circuit board. Mass contacting of the screen with the printed circuit board is provided by a plurality of spring-loaded tongues. These tongues are under elastic pretension once a screening tray is assembled and make electrical contact by line or point contact. Under harsh operating conditions it can occur that contacting fails as a result of mechanical effects or corrosion. In this case the screening efficiency of the interference suppression medium is adversely affected. A further disadvantage is that a compression force is necessary on assembly of the screening cover to overcome the spring pressure, said force having to be applied to the screen tray and borne by the printed circuit board. The screening effect depends on the contacting spring pressure and the distance between the individual contact points. If however a large number of spring tongues have to be elastically deformed a correspondingly greater compression force is required and it can occur with miniaturized modules that the circuit board is impermissibly deformed. Micro cracks can then develop in the conductive structure.

Contact is also established by contact springs around the edge of the screening in the screening device known from DE 297 13 412 U1.

Manufacturing these known one-piece screening devices requires a complex manufacturing tool. Changes to this tool required to produce a new screening geometry or spatial form are only possible with a comparatively large amount of effort.

SUMMARY OF THE INVENTION

The underlying object of the invention is to develop a screening device of the type stated at the start which improves screening efficiency and makes it possible to manufacture screening devices, especially those of different sizes, with less effort.

In accordance with the invention this object is achieved by the claims. The dependent claims make reference to advantageous embodiments.

In the inventive screening device there is provision for the contacting device to be formed by a sealing element running in a gap around the edge of the unit, with the sealing element being made of an elastic material which absorbs sources of electromagnetic waves. Characteristic of the invention is also the fact that linear or point contacting is not established by a plurality of contact points but by a sealing element made of elastic material lying on the surface of the board. Because of its compressibility this is better adapted to undulations and unevenness in the printed circuit board. Even with mechanical shocks or vibrations a lower contact resistance of ground contacting is maintained. In addition the sealing element running around the circumference in the gap between screening housing and circuit board forms a seal and in this way also protects the interior from contamination penetrating into the screening.

The constructional separation of the contacting and the screening frame makes it easier to manufacture. The tool for manufacturing the screening cover is a simpler design. Upgrade costs for changes to the manufacturing tool are lower. The screening cover can be manufactured at low costs as a punched-bent part from sheet metal. The sealing element can be a blank or a semi finished product. Overall manufacturing can be adapted to a partial screening of different-sized areas on a circuit board with little effort.

Surprisingly it has transpired that an EMF seal which is just a few millimeters wide provides very efficient screening against RF fields.

Materials which have an attenuating effect on electromagnetic radiation are known in various compositions and versions and are commercially available.

For easy attachment of the screening cover to the circuit board there is provision for the circuit board to be provided with openings and for an end of a lug projecting through the opening to be elastically deformed so that it grips the back of the printed circuit board. This produces a tight-fitting connection which is easy to establish. The plastic deformation of the projecting end sections can be formed by bending, stamping or pressing. To enable the cover to be easily removed for test purposes each end part of a lug can be embodied as a hinged flap.

As regards the manufacturing costs it is useful for the screening cover to be formed from a uniform material and in one piece from a metallic material, for example from sheet metal. The sheet metal can be protected by tin plating.

In a further embodiment of the invention there is provision for the edge of the cover to be embodied as a right-angled folded edge which, in the assembled state of the screening cover essentially runs parallel to the component side and for each lug to be formed on the outside circumference and to be embodied offset from a wall of the screening cover. This enables the screening cover to be manufactured using a punching or bending process.

With this punched-bent part a very effective screening cover can be implemented by embodying the sealing element as a flat seal and attaching it by electrically-conductive adhesive to the edge of the screening cover or the component side of the circuit board. This produces the additional advantage of enabling the screening cover along with the seal to be handled as one piece during assembly.

To improve contact reliability the conducting contour of the circuit board features domed contact points which press into the flat seal. Its surface is sealed by the elastic flat seal and largely protected against corrosion.

If only partial areas on a printed circuit board need to be screened it can be useful for the screening cover to be embodied in a rectangular shape to match the pitch of the printed circuit board as regards the geometry. This uniform modular construction reduces manufacturing and logistics costs.

For the case where the interior of the screening cover has to be ventilated or vented there is provision for holes to be provided in the top or the side walls of the screening cover to form openings for cooling air. The size of the holes is adapted to the frequency spectrum to be screened.

If part areas with different screening effects are required on the circuit board there is provision for a number of screening covers to be arranged on the printed circuit board and for the screening efficiency of these covers to differ.

To further reduce costs, commercially-available EMC materials can be used, that is polymer materials, the particular preference being for polyamide fleece which has a metal coating or is enclosed by a metal mesh.

BRIEF DESCRIPTION OF THE DRAWINGS

The invention is explained below in greater detail on the basis of an exemplary embodiment shown in the drawings. The drawings show.

DETAILED DESCRIPTION OF THE INVENTION

Figure 1:
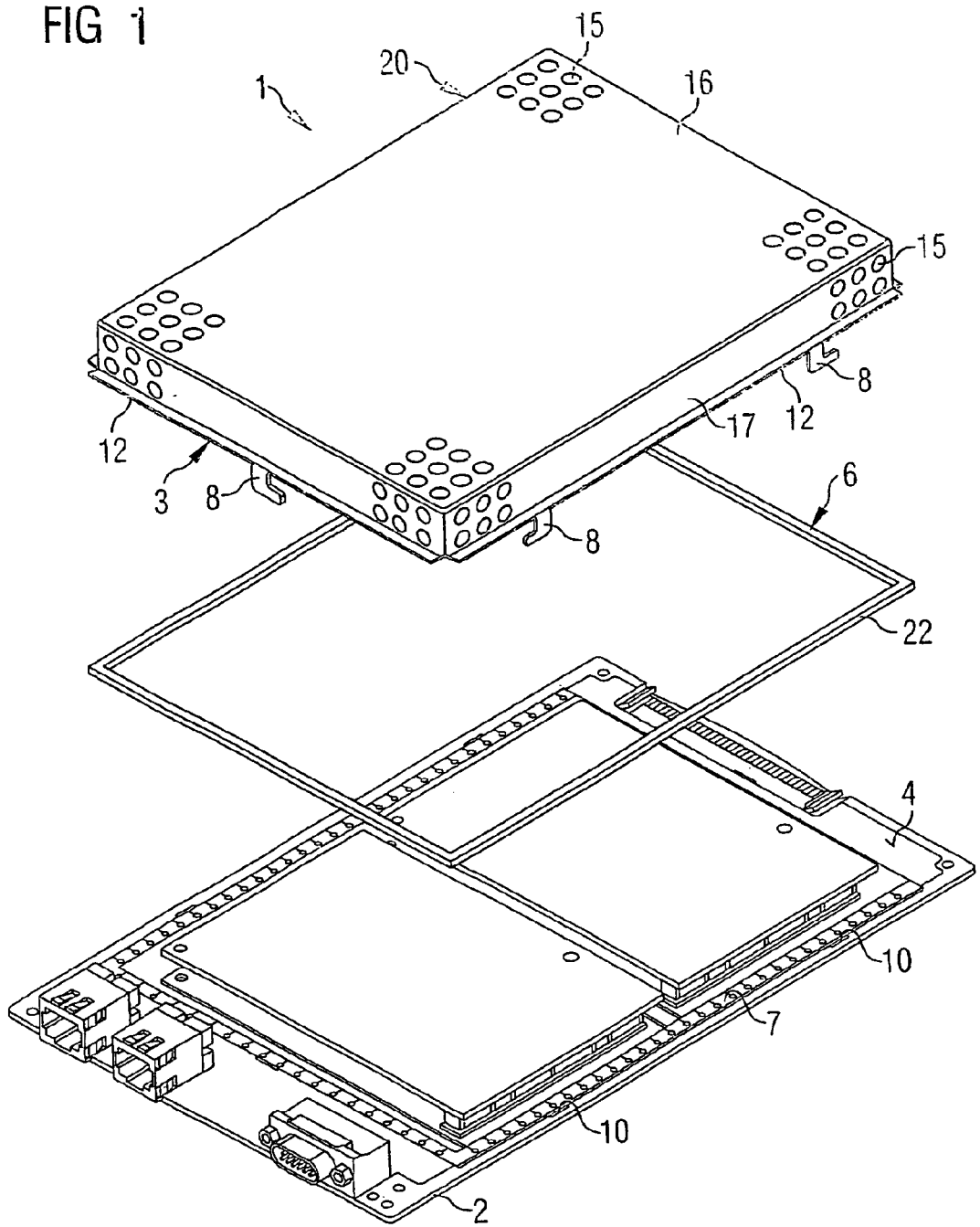
FIG. 1 a perspective exploded diagram of the inventive screening device, in a embodiment in which the entire printed circuit board is covered by the screening cover, FIG. 2 an enlarged detailed diagram of the screening cover from below, FIG. 3 a detailed cross-sectional view of the edge area of a screening device mounted on a printed circuit board, FIG. 4 a section of the conducting contour on the printed circuit board with contact points arranged offset at intervals.

In the drawings FIG. 1 shows a typical embodiment of the inventive screening device 1 in an exploded perspective view. The screening device 1 consists of a screening cover 20 and a contact device 6. In the example shown, the screening cover 20 covers the entire area of the printed circuit board 2. The explanations below are not however restricted to this embodiment but in particular also include screening devices which cover only parts of the printed circuit board.

As shown in FIG. 1 lugs 8 are formed on the outer edge 3 of the screening cover by which the screening cover 20 can be attached to a component side 4 of the printed circuit board 2. On the component side 4 of the printed circuit board 2 a guide contour 7 can be seen of which the outline corresponds to the edge area of the screening cover 20. The guide contour 7 consists of contact points which are explained in greater detail below and is etched to correspond to the pitch of the board. The contact device 6 is embodied as a seal 22 running around the edge. When the screening device is assembled the screening cover 20 is lowered onto the printed circuit board 2. As the cover is lowered onto the board, lugs 8 pointing in the direction of the printed circuit board 2 engage in openings 10 of the circuit board As the lowering operation proceeds the elastic sealing element 22 is initially compressed. Because of the good compression characteristics of the seal material only a light force is required to compress the seal. Lowering the cover further causes the end 9 of the lug 8 to pass through the opening and project beyond the back of the board. To attach the screening cover the lugs now projecting from the opening on the exit side are plastically deformed by bending them on both sides. A tight-fitting connection is made between cover 20 and carrier 2. As already shown, the plastic deformation can however also be made by bending, by stamping or by pressing. In the gap between the edge of the cover and the component side the elastic sealing element 22 will be compressed. The electromagnetic radiation energy penetrating into the sealing gap 5 is greatly attenuated as a result of the damping material properties of the sealing material. Because the sealing material is only slightly compressed assembly requires only a comparatively light pressure.

FIG. 1 shows the screening cover with two preformed attachment lugs on its long side and one lug on its short side. Of course the number of attachment lugs varies in accordance with the size of the screening cover. The openings 15 for ventilation or venting of the interior are shown greatly enlarged. The diameter of these holes is in reality very small and tuned to the frequency of the alternating field to be screened. Screening cover 20 is a one-piece bent-punched element made from tin-plated sheet metal.

FIGS. 2 and 3 show the edge area of the screening cover in an enlarged detailed view. The edge 3 of the screening cover 20 is continued by a right-angled fold 12. On the outside circumference the lug 8 is formed on the fold 12. The end section 9 of the lug is embodied as a hinged flap 11. As can be easily seen from the cross-sectional diagram shown in FIG. 3, the lug 8 is inserted through the opening 10 of the printed circuit board 2. The end section 9 is plastically deformed along the axis pointing in the direction of insertion by bending on both sides. In this way the hinged flap 11 grips the back of the printed circuit board 2. With a closed embodiment of the screening cover the seal running around the edge 22 also simultaneously protects the interior 18 against dust or contamination entering from the outside 19. In the cross-sectional view shown in FIG. 3 the seal 22 is shown as a flat seal 13. It is located in the sealing gap 5 between the printed circuit board 2 and the edge 12 under elastic pretension. The flat seal 13 is coated on its upper side with an adhesive 14 which means that seal and screening cover form a single unit for assembly and are easier to handle. The underside of the flat seal 13 lies along the conducting contour 7 on the component side 4. The conducting contour 7 is formed by stepped contact points 21 linked electrically by a corresponding layout. Compressing the seal in the gap 5 causes the seal material to deform elastically. The contact points 21 press on the underside of the flat seal This enclosure of the domed surface of the contact point means that it is very well protected from outside influences. This counters the effects of corrosion in the contact area. The result is that over a very long period of use the ohmic resistance of the ground contacting can be kept very low. Contour 7 can also be formed by a continuous conductor track or by another contact pattern. Naturally it is also possible to coat the other side of the flat seal 13 with a conductive adhesive.

The arrangement of the dome-shaped contacts 21 along the conducting contour 7 is shown in an enlarged view in FIG. 4. The contact points 21 are arranged staggered at intervals. The gap between the contact points in the lengthwise direction of the mass contacting is four millimeters in the example. The domes on the contact points are tinned and have a diameter of 1.3 millimeters. The EMC flat seal is made of a polyamide spun bond fleece which has a high compressibility of up to 85 percent and is very flexible.

The EMC seal can however be constructed in a different way and made of other materials. The seal can for example be an open-cell foam plastic to which electrically and magnetically conductive particles are added. Woven and compound materials are also suitable which contain fibers of a material with these conductivity properties.

The metal mesh can be a tinned, copper-coated steel wire mesh. The sealing element can be braided by the steel mesh. It is also possible however for the metallic mesh to be embedded into the sealing element by polymer attachment.

What is claimed is:

1. A screening device, comprising:
   a screening cover, which covers an electronic subassembly arranged on a printed circuit board, with an edge which is spaced from a component side of the circuit board by a gap; and
   a contact device which is arranged in the gap and establishes an electrical connection between the screening cover and a conducting contour on the circuit board, wherein
   lugs are formed on the edge of the screening cover by which the screening cover is attached to the circuit board and the contact device is held under elastic pretension, wherein
   the contact device being embodied as an elastic sealing element running around the circumference of the gap and absorbing electromagnetic waves, and wherein
   the conducting contour is formed by dome-shaped contact points.

2. The screening device in accordance with claim 1, wherein the dome-shaped contact points are arranged on the component side of the printed circuit board at the printed circuit board pitch, or at a grid dimension of the printed circuit board, or at a lead-wire spacing of the printed circuit board.

3. The screening device in accordance with claim 1, wherein the printed circuit board further comprises openings through which the lugs of the screening cover protrude on the exit side and wherein plastically deformed end sections of the lugs grip the back of the printed circuit board.

4. The screening device in accordance with claim 2, wherein the printed circuit board further comprises openings through which the lugs of the screening cover protrude on the exit side and wherein plastically deformed end sections of the lugs grip the back of the printed circuit board.

5. The screening device in accordance with claim 3, wherein each end section of a lug is designed as a hinged flap or a twist-lock flap.

6. The screening device in accordance with claim 1, wherein the screening cover is embodied in a uniform material and in one piece and is made of metal.

7. The screening device in accordance with claim 2, wherein the screening cover is embodied in a uniform material and in one piece and is made of metal.

8. The screening device in accordance with claim 1, wherein the screening cover is designed in a uniform material, merged into each of its elements, and is made of a metallic material.

9. The screening device in accordance with claim 1, wherein the edge is designed as a right-angled fold running in the assembled state of the screening cover essentially parallel to the component side, and wherein each lug is formed on the outside circumference and is embodied offset along a wall of the screening cover.

10. The screening device in accordance with claim 2, wherein the edge is designed as a right-angled fold running in the assembled state of the screening cover essentially parallel to the component side, and wherein each lug is formed on the outside circumference and is embodied offset along a wall of the screening cover.

11. The screening device in accordance with claim 1, wherein the sealing element is designed as a flat seal and is attached by an electrically conductive adhesive at the edge of the screening cover or the component side.

12. The screening device in accordance with claim 2, wherein the sealing element is designed as a flat seal and is attached by an electrically conductive adhesive at the edge of the screening cover or the component side.

13. The screening device in accordance with claim 1, wherein the screening cover is embodied as a punched-bent part.

14. The screening device in accordance with claim 2, wherein the screening cover is embodied as a punched-bent part.

15. The screening device in accordance with claim 1, wherein the screening cover is designed in a cuboidal or rectangle shape.

16. The screening device in accordance with claim 1, wherein cutouts are provided on a top and/or a side wall of the screening cover.

17. The screening device in accordance with claim 1, wherein a plurality of screening covers are arranged on a printed circuit board and the screening efficiency of these screen covers is different.

18. The screening device in accordance with claim 1, wherein the sealing element is formed from a polymer material metallically coated or surrounded by a metallic mesh.

19. The screening device in accordance with claim 18, wherein the polymer material is a polyamide weave or fleece.

20. The screening device in accordance with claim 1, wherein the sealing element is formed from an electrically conductive elastomer braided by a tinned copper-coated steel wire mesh.

* * * * *